United States Patent
Terada

(10) Patent No.: US 10,330,518 B2
(45) Date of Patent: Jun. 25, 2019

(54) METHOD FOR MANUFACTURING A LIQUID-SURFACE DETECTION DEVICE

(71) Applicant: DENSO CORPORATION, Kariya, Aichi-pref. (JP)

(72) Inventor: Yoshifumi Terada, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 373 days.

(21) Appl. No.: 14/914,584

(22) PCT Filed: Aug. 6, 2014

(86) PCT No.: PCT/JP2014/004096
§ 371 (c)(1),
(2) Date: Feb. 25, 2016

(87) PCT Pub. No.: WO2015/029343
PCT Pub. Date: Mar. 5, 2015

(65) Prior Publication Data
US 2016/0209262 A1    Jul. 21, 2016

(30) Foreign Application Priority Data
Aug. 27, 2013 (JP) .................................. 2013-175818

(51) Int. Cl.
*G01F 23/38* (2006.01)
*H05K 3/32* (2006.01)

(52) U.S. Cl.
CPC .............. *G01F 23/38* (2013.01); *H05K 3/32* (2013.01); *H05K 2203/1316* (2013.01)

(58) Field of Classification Search
CPC ... G01F 23/38; H05K 2203/1316; H05K 3/32
See application file for complete search history.

(56) References Cited

U.S. PATENT DOCUMENTS 5,535,512 A * 7/1996 Armogan ........... H01R 13/5202
29/877
7,458,261 B2 * 12/2008 Miyagawa ............ G01F 23/363
73/290 R (Continued)

FOREIGN PATENT DOCUMENTS

JP     S62106692 A    5/1987
JP     H11016767 A    1/1999

(Continued)

OTHER PUBLICATIONS

International Search Report and Written Opinion (in Japanese with English Translation) for PCT/JP2014/004096, dated Nov. 4, 2014; ISA/JP.

*Primary Examiner* — Minh N Trinh
(74) *Attorney, Agent, or Firm* — Harness, Dickey & Pierce, P.L.C.

(57) ABSTRACT

A liquid-surface detection device includes terminals and an electronic component that has a body portion and a lead portion projecting from the body portion and being connected to the terminals. A method for manufacturing the liquid-surface detection device includes arranging the electronic component in a casing that has a mounting surface and covers the terminals, and connecting the lead portion and the terminals. The mounting surface has a base surface with a planar shape, an island projecting from the base surface and a hole recessed from the base surface. The lead portion is placed in a positioning groove of the island. A curved surface of the body portion is supported by an edge of the hole. Accordingly, a yield can be increased.

5 Claims, 7 Drawing Sheets

(56) References Cited

U.S. PATENT DOCUMENTS

| | | | |
|---|---|---|---|
| 9,752,920 B2* | 9/2017 | Sato | G01F 23/363 |
| 2012/0111108 A1* | 5/2012 | Hashimoto | G01F 23/363 |
| | | | 73/317 |
| 2015/0192453 A1* | 7/2015 | Terada | G01F 23/38 |
| | | | 73/305 |
| 2016/0209262 A1* | 7/2016 | Terada | G01F 23/38 |

FOREIGN PATENT DOCUMENTS

| | | |
|---|---|---|
| JP | 2005228782 A | 8/2005 |
| JP | 2007010874 A | 1/2007 |
| JP | 2011203022 A | 10/2011 |

* cited by examiner

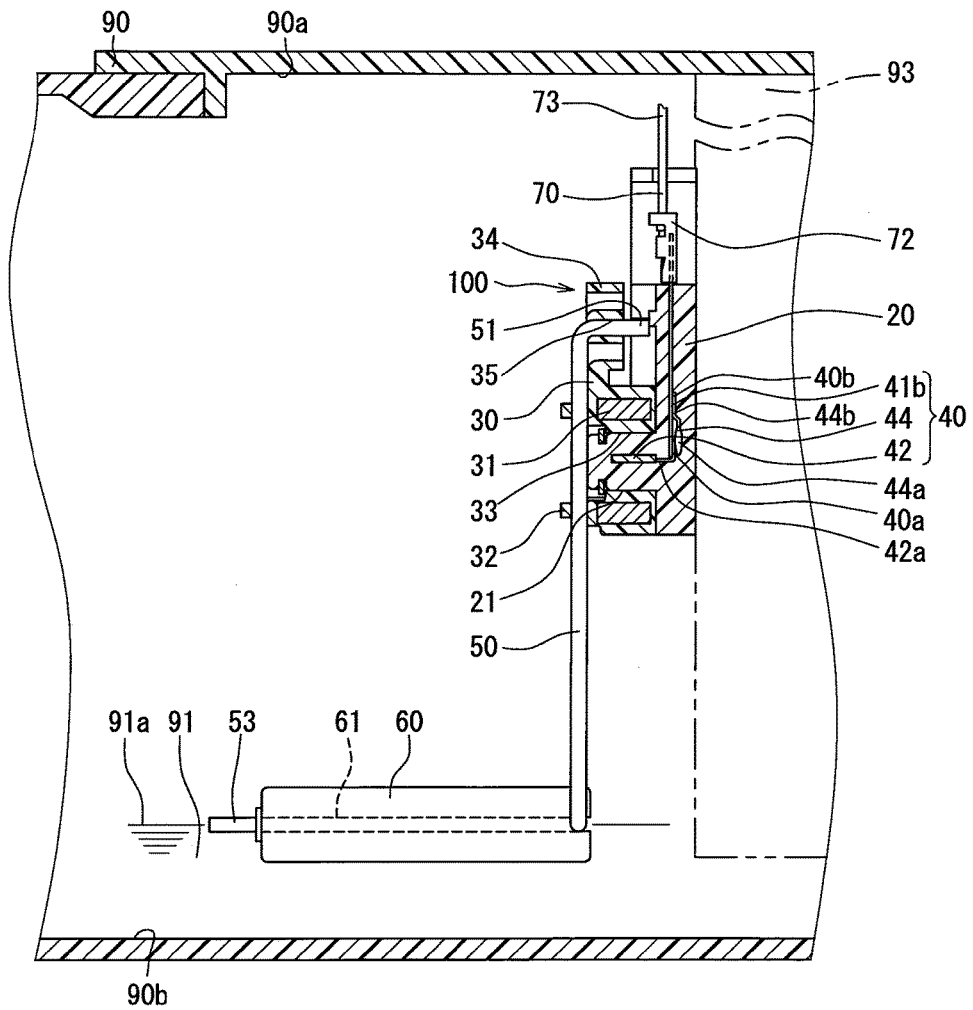
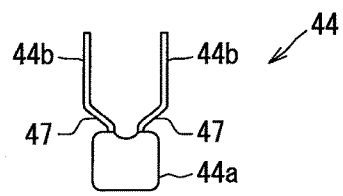

METHOD FOR MANUFACTURING A LIQUID-SURFACE DETECTION DEVICE

CROSS REFERENCE TO RELATED APPLICATIONS

This application is a U.S. National Phase Application under 35 U.S.C. 371 of International Application No. PCT/JP2014/004096 filed on Aug. 6, 2014 and published in Japanese as WO 2015/029343 A1 on Mar. 5, 2015. This application is based on and claims the benefit of priority from Japanese Patent Application No. 2013-175818 filed on Aug. 27, 2013. The entire disclosures of all of the above applications are incorporated herein by reference.

TECHNICAL FIELD

The present disclosure relates to a method for manufacturing a liquid-surface detection device that detects a level of a liquid-surface of a liquid stored in a container, and the liquid-surface detection device manufactured by the method.

BACKGROUND ART

A method for manufacturing a liquid-surface detection device that detects a level of a liquid-surface of a liquid stored in a container has been conventionally known. As the method for manufacturing the liquid-surface detection device, for example, in a method for manufacturing a liquid-surface detection device disclosed in patent literature 1, positioning grooves with a longitudinal shape are formed on a mounting surface. One end of each positioning groove in a longitudinal direction (a direction in which lead portions of the electronic component project) is a closed end and the other end of the positioning groove is an open end. Side wall surfaces of the positioning groove restrict the lead portion from moving in a direction intersecting the longitudinal direction of the positioning groove, that is, a width direction of the positioning groove. As a result, the electronic component whose lead portions are received in the positioning grooves can be positioned with respect to the width direction of the positioning grooves.

PRIOR ART LITERATURE

Patent Literature

Patent literature 1: JP 2011-203022 A

SUMMARY OF INVENTION

In the method for manufacturing the liquid-surface detection device disclosed in patent literature 1, however, a width of each positioning groove is larger than a thickness of the lead portion and the positioning groove has a clearance from the lead portion. Therefore, in the method for manufacturing the liquid-surface detection device disclosed in patent literature 1, there is a possibility that the electronic component slips out in the longitudinal direction. In this case, it will be difficult to execute the following connecting step accurately. Also, in the case where jigs are used as described in patent literature 1, it is required to prepare the jigs and arrange the jigs accurately.

The present disclosure is made in view of the forgoing issues, and it is an object of the present disclosure to provide a method for manufacturing a liquid-surface detection device enabling an accurate connecting step and increasing a yield.

According to a first aspect of the present disclosure, a method for manufacturing a liquid-surface detection device including terminals and an electronic component includes molding a casing that has a mounting surface and covers the terminals, arranging a body portion and a lead portion of the electronic component after the molding, and connecting the lead portion and corresponding one of the terminals after the arranging. The terminals output, to outside, an electrical signal of a detecting element portion detecting a level of a liquid-surface of a liquid stored in a container. The electronic component has the body portion and the lead portion projecting from the body portion and being connected to the corresponding one of the terminals. The mounting surface of the casing has a base surface with a planar shape, an island projecting from the base surface and defining a positioning groove, and a hole recessed from the base surface. The lead portion and the body portion is arranged so that the lead portion is placed in the positioning groove to have a clearance from the island and extend along the base surface, and a curved surface of the body portion projecting toward the mounting surface is held by an edge of the hole.

According to the first aspect described above, in the arranging, the lead portion and the body portion is arranged so that the lead portion is placed in the positioning groove to have the clearance from the island and extend along the base surface, and the curved surface of the body portion projecting toward the mounting surface is held by the edge of the hole. Because of this arrangement, even when the positioning groove has a clearance from the lead portion, the electronic component can be restricted from being displaced. Furthermore, in the connecting after the arranging, since the electronic component is less likely to be displaced, the lead portion and the terminals can be connected securely. As a result, the method for manufacturing the liquid-surface detection device capable of increasing a yield can be provided.

According to a second aspect of the present disclosure, the method for manufacturing the liquid-surface detection device further includes covering the electronic component, after the connecting, by disposing the casing in a cavity of a metal mold and inserting a molding material in the cavity. In the molding, the hole is formed to have a bottom surface.

According to the second aspect described above, since the electronic component is covered in the covering, the electronic component can be restricted from being in contact with the liquid. Also, since the hole is formed to have the bottom surface in the molding, in the covering, the molding material is restricted from flowing to the hole from a surface opposite to the mounting surface, and the body portion can be restricted from floating up and being exposed to outside.

According to a third aspect of the present disclosure, a direction in which the lead portion arranged in the arranging projects is referred to as a longitudinal direction, the lead portion of the electronic component has a bent portion that is bent to correspond to a distance between the terminals, and, in the molding, the island is formed to have an engaging portion to engage with the bent portion in the longitudinal direction According to the third aspect described above, in the case where the lead portion has the bent portion at which the lead portion is bent to correspond to the distance between the terminals, the engaging portion, which is formed in the island, supports the positioning of the electronic component in the longitudinal direction by engaging with the bent portion. Therefore, in the case where the body portion is displaced from the hole, since the engaging portion engages with the bent portion of the lead portion, the electronic component can be restricted from being displaced.

According to a fourth aspect of the present disclosure, a method for manufacturing a liquid-surface detection device including terminals and an electronic component includes arranging the electronic component in a casing that has a mounting surface and covers the terminals, and connecting the lead portion and corresponding one of the terminals after the arranging. The terminals output, to outside, an electrical signal of a detecting element portion detecting a level of a liquid-surface of a liquid stored in a container. The electronic component has the body portion having a curved surface and the lead portion projecting from the body portion and being connected to the corresponding one of the terminals. The mounting surface of the casing has a base surface with a planar shape, an island projecting from the base surface in one direction and defining a positioning groove, and a hole recessed from the base surface in a direction opposite to the one direction. The electronic component is arranged so that the lead portion is accommodated in the positioning groove, a part of the curved surface of the body portion is accommodated in the hole, and the curved surface is supported by an edge defined by the base surface and a side surface of the hole.

Also in the method according to the fourth aspect described above, the electronic component can be restricted from being displaced and, in the connecting, since the electronic component is less likely to be displaced, the lead portion and the terminals are connected securely. As a result, the method for manufacturing the liquid-surface detection device capable of increasing a yield can be provided.

In the liquid-surface detection device manufactured by any of the method described above, the electronic component is suitably mounted on the mounting surface and the lead portion and the terminal portion are securely connected. Therefore, connection reliability of the liquid-surface detection device can be increased.

BRIEF DESCRIPTION OF DRAWINGS

The above and other objects, features and advantages of the present disclosure will become more apparent from the following detailed description made with reference to the accompanying drawings, in which:

FIG. 2 is a cross-sectional view taken along a line II-II of FIG. 1;

FIG. 3 is a front view of a capacitor of FIG. 2;

DESCRIPTION OF EMBODIMENTS

An embodiment of the present disclosure will be hereinafter described with reference to drawings.

Figure 1:
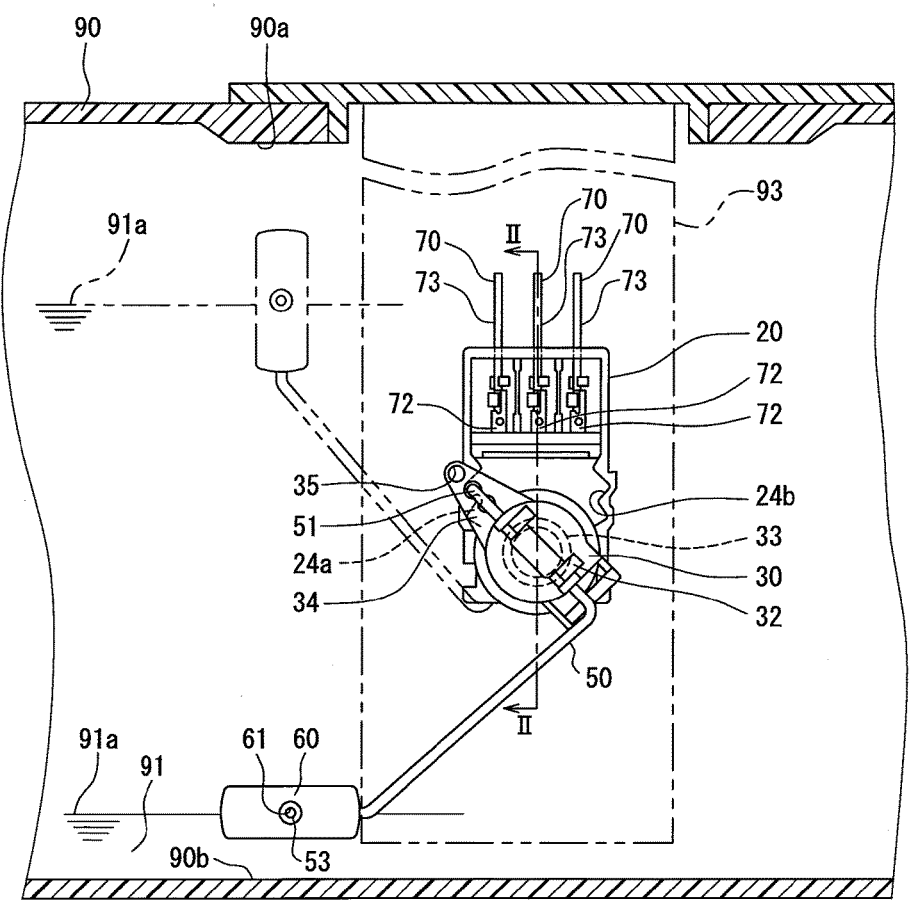
FIG. 1 is a front view of a fuel level gauge manufactured by a method according to an embodiment of the present disclosure.

As shown in FIG. 1, an example in which a liquid-surface detection device according to an embodiment of the present disclosure is employed to a fuel level gauge will be described. The fuel level gauge is placed in a fuel tank 90 of a vehicle, detects a level of a liquid-surface 91a of a fuel 91 stored in the fuel tank 90, and outputs an output-result to a combination meter or the like (not illustrated).

As shown in FIG. 1 and FIG. 2, a fuel level gauge 100 according to the present embodiment is fixed to the fuel tank 90, which is a container. The fuel level gauge 100 is attached to a wall of a pump module 93 that is located in the fuel tank 90, and is integrally fixed to the fuel tank 90 through the pump module 93. A method for fixing the fuel level gauge 100 to the fuel tank 90 is not limited in the way described above. The fuel level gauge 100 may be directly fixed to an inside of the fuel tank 90 through a stage or the like (not illustrated).

(Basic Structure)

A basic structure of the fuel level gauge 100 will be described with reference to FIG. 1 and FIG. 2. The fuel level gauge 100 includes a float 60, a float arm 50, a magnet holder 30, a housing 20, a circuit portion 40, and wirings 70.

The float 60 is a member such as a foamed ebonite having a low specific gravity. Since the float 60 has a specific gravity lower than the fuel 91, which is a liquid, the float 60 can float on the liquid-surface 91a. The float 60 has a thin rectangular parallelepiped shape to detect the level of the liquid-surface 91a even when only a small amount of the fuel 91 remains. The float 60 has a through hole 61 that passes through a geometric center of the float 60. The shape of the float 60 is not limited to the rectangular parallelepiped shape as described above, and may be a columnar shape or the like.

The float arm 50 is a core member with a round bar shape made of metal such as stainless steel. An end portion of the float arm 50 adjacent to the float 60 is bent by about 90° in a direction same as a direction in which a rotation axis of the magnet holder 30 extends to provide a float holding portion 53. The float arm 50 holds the float 60 by the float holding portion 53 inserted into the through hole 61 of the float 60. The other end portion of the float arm 50 adjacent to the magnet holder 30 is bent by about 90° in the direction same as the direction in which the rotation axis of the magnet holder 30 extends and toward the housing 20 to provide a stopper portion 51.

The magnet holder 30 has a cylindrical shape and is made of a resin having high oil resistance, high solvent resistance and excellent mechanical property, such as a polyacetal resin (POM). The magnet holder 30 has a flange portion 34 and a float arm fixing portion 32. The flange portion 34 has a shaft receiving portion 33, a magnet 31 and a stopper hole 35. The magnet holder 30 is supported by the housing 20 through the shaft receiving portion 33 provided at an inner peripheral surface of the magnet holder 30 and can rotate freely.

The magnet 31 is a member with a cylindrical shape and shows ferromagnetism. The magnet 31 is fixed to the magnet holder 30 by an insert molding or the like. The magnet 31 has a center axis corresponding to a center axis of the magnet holder 30 and rotates integrally with the magnet holder 30. For example, a permanent magnet such as a ferrite magnet, a rear earth magnet, an Alnico magnet and a plastic magnet can be used as the magnet 31.

The flange portion 34 is provided at an external peripheral surface of the magnet holder 30 and has a stopper hole 35. The float arm 50 is fixed to the float arm fixing portion 32 by the stopper portion 51 inserted in the stopper hole 35.

As described above, since the float arm 50 has one end portion supported by the magnet holder 30, the float 60 follows the liquid-surface 91a of the fuel 91 and moves in the vertical direction in the fuel tank 90. The vertical reciprocating motion of the float 60 is converted to a rotating motion and transmitted to an integrated element including the float arm 50 and the magnet holder 30. As a result, the magnet holder 30 follows the liquid-surface 91a of the fuel 91 stored in the fuel tank 90 and rotates relative to the housing 20.

The housing 20 has a rectangular plate shape and is made of a resin such as polyphenylenesulfide (PPS) that is not eroded by an organic solvent such as the fuel 91 and does not lose its strength even at a high temperature. The housing 20 is attached to the wall of the fuel pump module 93 in a state where a longitudinal direction of the housing 20 extends along a vertical direction and fixes the fuel level gauge 100 to the fuel tank 90. The housing 20 has a shaft portion 21 and stopper walls 24a and 24b.

The shaft portion 21 is provided near a center portion of the housing 20 and is a projecting portion with a cylindrical shape projecting in a plate thickness direction of the housing 20. Since the shaft receiving portion 33 of the magnet holder 30 is fitted on an outer periphery of the shaft portion 21, the magnet holder 30 is supported by the housing 20 and can rotate freely. Further, since an external diameter of the shaft portion 21 is slightly smaller than an inner diameter of the shaft receiving portion 33, the magnet holder 30 can smoothly rotate relative to the housing 20.

The stopper walls 24a and 24b are provided at two walls of the housing 20, the two walls opposing in a horizontal direction in a state where the housing 20 is attached to the wall of the fuel pump module 93. The stopper walls 24a and 24b are provided at positions on a rotation orbit of the stopper portion 51 so that the stopper walls 24a and 24b can be in contact with the stopper portion 51. The stopper wall 24a is for preventing the float 60 from being in contact with a bottom surface 90b of the fuel tank 90. When only a small amount of the fuel 91 remains in the fuel tank 90 (expressed by a solid line in FIG. 1), the stopper wall 24a is in contact with the stopper portion 51. The stopper wall 24b is for preventing the float 60 from being in contact with a ceiling surface 90a of the fuel tank 90. When a maximum amount of the fuel 91 is in the fuel tank 90 (expressed by a two-dot chain line in FIG. 1), the stopper wall 24b is in contact with the stopper portion 51.

The circuit portion 40 includes a magneto-electric converting element 42, terminals 41a, 41b, 41c and a capacitor 44, and detects a rotation angle of the magnet holder 30.

The magneto-electric converting element 42 is implanted in the shaft portion 21 of the housing 20 so that the magneto-electric converting element 42 is placed inside of the inner periphery of the magnet 31 disposed in the magnet holder 30. The magneto-electric converting element 42 has three input/output portions 42a, as an input terminal, a ground terminal and an output terminal. The three input/output portions 42a are connected to the terminals 41a, 41b and 41c (see FIG. 9). The magneto-electric converting element 42 is a hole element. When the magneto-electric converting element 42 is affected by an external magnetic field during a voltage is applied to the magneto-electric converting element 42, the magneto-electric converting element 42 outputs a voltage as a detection result from an output terminal of the input/output portions 42a, the voltage being proportional to a density of magnetic flux passing through the magneto-electric converting element 42

The terminals 41a, 41b and 41c are made of a phosphor bronze plate or a brass plate having high conductivity. Three terminals 41a, 41b, 41c are implanted in the housing 20 and arranged in the horizontal direction of the housing 20. The terminals 41a, 41b, 41c have a plate shape extending in the vertical direction of the housing 20. The terminal 41a of the three terminals 41a, 41b and 41c is the closest to the stopper wall 24a. The terminal 41c is the closest to the stopper wall 24b. The terminal 41b is arranged between the terminal 41a and the terminal 41c. The terminals 41a to 41c are electrically connected to the input/output portions 42a at lower end portions in the vertical direction, each of the lower end portions being one of both end portions of the terminals 41a to 41c in a direction in which the terminals 41a, 41b, 41c extend. The upper end portions in the vertical direction of the terminals 41a, 41b, 41c, which are implanted in the housing 20, project out of the housing 20.

Figure 4:
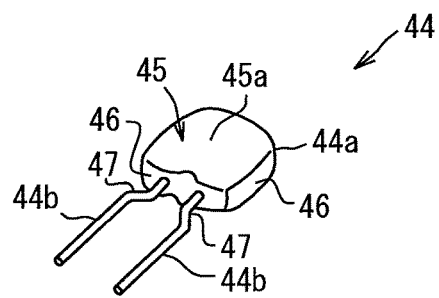
FIG. 4 is a perspective view of the capacitor of FIG. 2.
Figure 5:
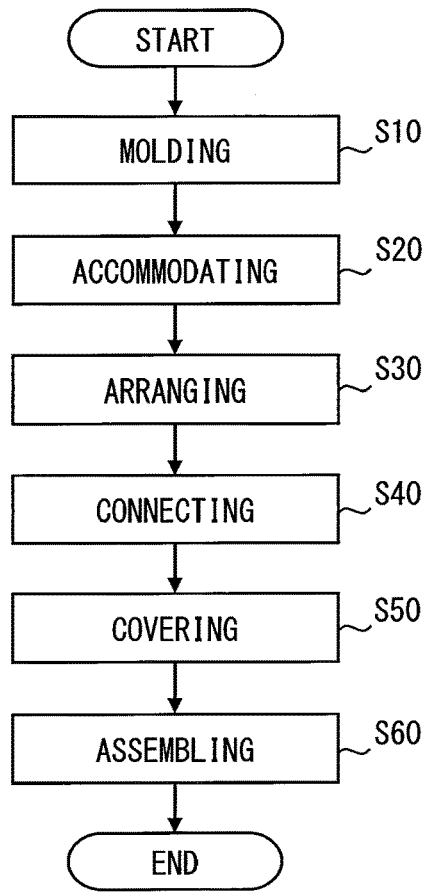
FIG. 5 is a flowchart illustrating the method according to the embodiment.

The capacitor 44 is a passive element that can store and release a charge the amount of which corresponds to a predetermined capacitance. The capacitor 44 eliminates a noise that is generated or inputted in the circuit portion 40. As shown in FIG. 3 and FIG. 4, the capacitor 44 has a body portion 44a and two lead portions 44b. A curved surface 45 of the body portion 44a projecting to outside is formed by putting an dielectric between electrodes that is electrically connected to the lead portions 44b (not illustrated), and covering the dielectric and the electrodes with an exterior material. The lead portions 44b are metallic wires. Two lead portions 44b project from a side surface 46 of the body portion 44a and are substantially parallel to each other. A direction in which the lead portions 44b project is referred to as a longitudinal direction of the capacitor 44. Since ends of the lead portions 44b in the longitudinal direction are welded to any of the terminals 41a to 41c, the capacitor 44 is connected to the terminals 41a to 41c.

In the present embodiment, the circuit portion 40 has two capacitors 44. One capacitor 44 has one lead portion 44b connected to the terminal 41a and the other lead portion 44b connected to the terminal 41b. The other capacitor 44 has one lead portion 44b connected to the terminal 41b and the other lead portion 44b connected to the terminal 41c. The lead portions 44b of each capacitor 44 have bent portions 47 that are bent to correspond to distances between the terminals (41a and 41b, or 41b and 41c).

The terminals 41a to 41c have detecting element connecting portions 40a to which the input/output portions 42a of the magneto-electric converting element 42 are connected. Also, the terminals 41a to 41c have capacitor connecting portions 40b to which the lead portions 44b of the capacitors 44 are connected.

Three wirings 70 are provided to the fuel level gauge 100 and connected to the terminals 41a to 41c. The detection result of the rotation angle of the magnet holder 30 detected by the magneto-electric converting element 42 is transmitted through the wirings 70 to a measuring device such as a combination meter provided outside of the fuel tank 90.

Each wiring 70 has a terminal portion 72 and a conducting wire 73. The terminal portion 72 is made of a phosphor bronze plate or a brass plate having high conductivity. The terminal portion 72 is securely and electrically connected to each of the terminals 41a to 41c by being crimped or fused. The conducting wire 73 is provided by covering an outer surface of a metallic wire having a high conductivity with an insulator such as a rubber.

Accordingly, one terminal 41a is electrically connected to a battery (not illustrated) through the wiring 70, and can transform and apply the battery voltage to one of the input/output portion 42a used as the input terminal of the magneto-electric converting element 42. Another terminal 41b is grounded through the wiring 70, and can provide a ground voltage to one of the input/output portion 42a used as the ground terminal of the magneto-electric converting element 42. The other terminal 41c is connected to the external measuring device such as the combination meter through the wiring 70, and can output an electrical signal as the detection result from one of the input/output portion 42a used as the output terminal of the magneto-electric converting element 42.

According to the structure described above, the fuel level gauge 100 outputs a voltage based on a level of the liquid-surface 91a of the fuel 91. Specifically, the voltage, which is outputted by the magneto-electric converting element 42 as the output result, changes according to an angle formed by the magneto-electric converting element 42 and the magnetic flux generated by the magnet 31 that integrally rotates with the magnet holder 30.

(Method for Manufacturing)

Next, the method for manufacturing the fuel level gauge 100 according to the present embodiment will be described in detail with reference to FIG. 5 to FIG. 12. As shown in a flowchart of FIG. 5, the method for manufacturing the fuel level gauge 100 includes a molding step S10, an arranging step S30, a connecting step S40 and a covering step S50.

Figure 6:
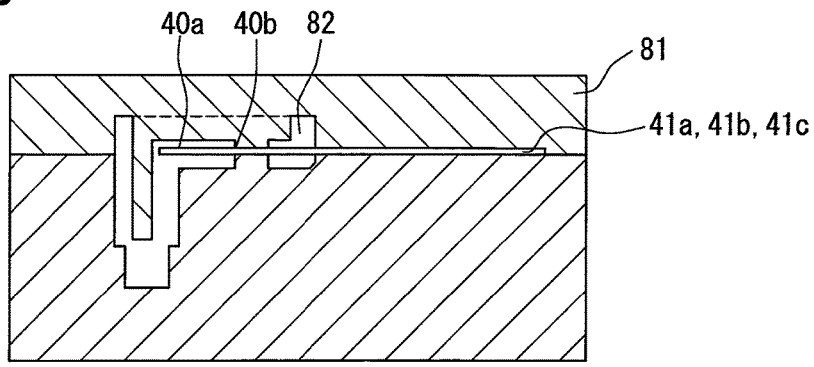
FIG. 6 is a diagram illustrating a molding step of FIG. 5.

In the molding step S10, the terminals 41a to 41c are disposed in a cavity 82 of a first metal mold 81 (see FIG. 6). A molding material (such as a PPS resin) for molding the housing 20 is melted and inserted into the cavity 82 of the first metal mold 81 to mold a casing 26 covering the terminals 41a to 41c. In FIG. 6, a gate through which the melted molding material is inserted is omitted.

Figure 7:
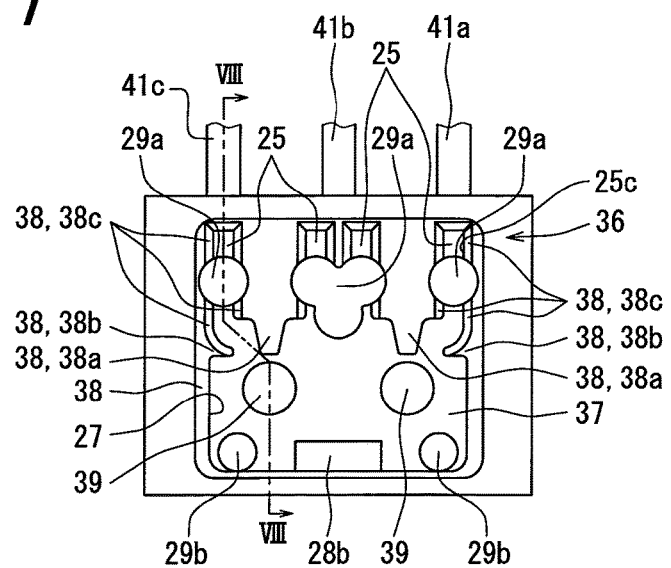
FIG. 7 is a front view of a mounting surface of a casing in the molding step of FIG. 5.
Figure 8:
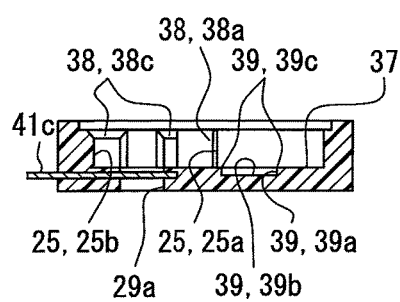
FIG. 8 is a cross-sectional view taken along a line VIII-VIII of FIG. 7.

The casing 26 molded in the molding step S10 has a mounting surface 36 as shown in FIG. 7 and FIG. 8. The mounting surface 36 has a base surface 37, an island 38 and holes 39. The base surface 37 has a planar shape and is substantially parallel to the direction in which the terminals 41a to 41c extend. The island 38 projects from the base surface 37 opposite to the terminals 41a to 41c with respect to a plate thickness direction of the terminals 41a to 41c. The island 38 defines positioning grooves 25, which are described later, together with a peripheral wall 27 surrounding the base surface 37. Each hole 39 has a cylindrical bore shape and recesses from the base surface 37 toward the terminals 41a to 41c. Since the hole 39 have a side surface 39a with a cylindrical shape and a bottom surface 39b with a planar shape, the hole 39 is bottomed. Also, the hole 39 has a substantially perpendicular edge 39c defined by the hole 39 and the base surface 37. The edge 39c is formed circumferentially along the hole 39.

Since the base surface 37 of the casing 26 covering the terminals 41a to 41c has electrode holes 29a, the capacitor connecting portions 40b of the terminals 41a to 41c are exposed. The base surface 37 has an element accommodating portion 28b for accommodating the magneto-electric converting element 42. Since the base surface 37 has electrode holes 29b, the detecting element connecting portions 40a of the terminals 41a to 41c are exposed.

Each positioning groove 25 has a longitudinal shape extending from an inner periphery of the peripheral wall 27 to an outer periphery of the peripheral wall 27. In other words, the positioning groove 25 has the longitudinal shape extending from the inside to the outside of the mounting surface 36. The positioning groove 25 has an open end 25a, a closed end 25b and side walls 25c. The number of the positioning grooves 25 accords with the total number of the lead portions 44b of the capacitors 44 that are connected to the terminals 41a to 41c. The adjacent positioning grooves 25 are substantially parallel to each other. A distance between the adjacent positioning grooves 25 corresponds to the distances between the terminals (41a and 41b, or 41b and 41c).

The open end 25a is one end of the positioning groove 25 in the longitudinal direction, and is open toward the inner periphery of the peripheral wall 27. The closed end 25b is the other end of the positioning groove 25 in the longitudinal direction, and is closed by the peripheral wall 27. The side walls 25c are walls of the positioning groove 25 extending from the open end 25a to the closed end 25b. The side walls 25c oppose each other in a width direction of the positioning groove 25. A width of the positioning groove 25, which is a distance between the side walls 25c, is set considering an error of an angle of the lead portion 44b projecting from the body portion 44a. Also, the width of the positioning groove 25 is set to be greater than a thickness of the lead portion 44b. Namely, the width of the positioning groove 25 is set so that the lead portion 44b is spaced from the side walls 25c. Additionally, upper portions of the closed end 25b and the side walls 25c have an inclined plane shape that inclines toward the positioning groove 25. For example, the upper portion of the closed end 25b has an inclined surface 38c that inclines toward the open end 25a. The upper portions of the side walls 25c have the inclined surfaces 38c that incline toward the positioning groove 25 in the width direction of the positioning groove 25.

The island 38 has projecting portions 38a between the open ends 25a of the adjacent positioning grooves 25, the projecting portions 38a projecting opposite to the closed ends 25b with respect to the longitudinal direction. Additionally, the island 38 has engaging portions 38b that project from the peripheral wall 27 in the width direction of the positioning groove 25. The engaging portions 38b partially blocks the open ends 25a at positions opposite to the closed ends 25b with respect to the open ends 25a. Upper portions of the engaging portions 38b also have the inclined surfaces 38c that incline toward the positioning grooves 25.

The holes 39 are formed on the base surface 37 and apart from the projecting portions 38a in a direction away from the closed ends 25b, considering a dimension L1 in the longitudinal direction of the body portion 44a of the capacitor 44. That is, each hole 39 is formed at a position so that a center of the hole 39 coincides with a center of the curved surface 45 of the body portion 44a of each capacitor 44.

Figure 9:
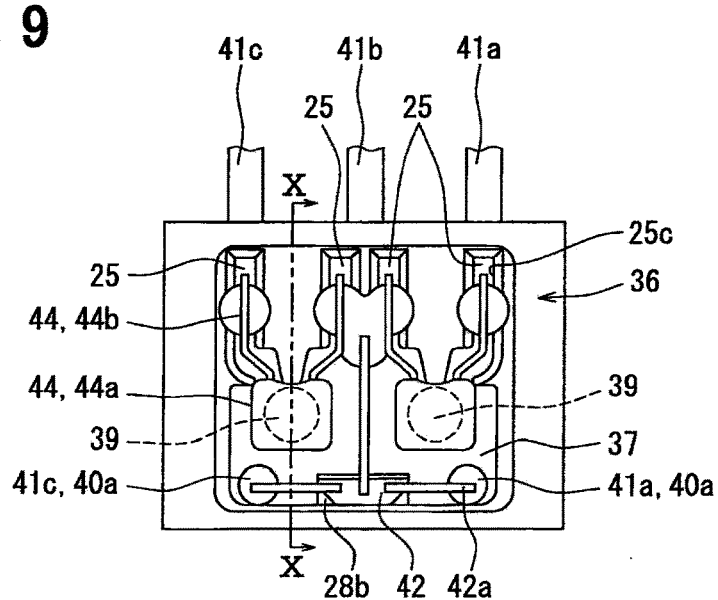
FIG. 9 is a front view of the mounting surface of the casing in an arranging step of FIG. 5.

In the element accommodating step S20 after the molding step S10, the magneto-electric converting element 42 is inserted to the element accommodating portion 28b (see, FIG. 9). By accommodating the magneto-electric converting element 42 in the element accommodating portion 28b, the input/output portions 42a and the detecting element connecting portions 40a are in contact with each other.

In the element accommodating step S20, a pair of electrodes with a columnar shape is prepared, and the detecting element connecting portions 40a and the input/output portions 42a are held between the pair of electrodes. While the detecting element connecting portions 40a and the input/output portions 42a are held between the electrodes, an electric current is applied between the electrodes to generate Joule heat at a contact region where the detecting element connecting portions 40a and the input/output portions 42a are in contact. The contact region of the detecting element connecting portions 40a and the input/output portions 42a are melted by the Joule heat. As such, the terminals 41a to 41c and the magneto-electric converting element 42 are connected by welding.

In the arranging step S30 after the element accommodating step S20 (that is, after the molding step S10), as shown in FIG. 9, the capacitors 44 are mounted on the mounting surface 36. Specifically, the lead portions 44b and the body portions 44a are arranged so that the lead portions 44b are placed in the positioning grooves 25 to extend along the base surface 37 and the curved surfaces 45 of the body portions 44a are held by the edges 39c of the holes 39.

For example, in the present embodiment, the terminals 41a to 4c and the casing 26 are disposed in a state where a surface, from which the base surface 37 is exposed, faces up at first. Next, the capacitors 44 are kept in a state where the longitudinal direction of the lead portions 44b and the base surface 37 are substantially parallel (in other words, a state where the curved surfaces 45 project toward the mounting surface 36), and a state where the longitudinal direction of the lead portions 44b corresponds to the direction in which the positioning grooves 25 extend. Thereafter, the capacitors 44 are mounted on the mounting surface 36 from the top. In more details, the capacitors 44 are dropped from drop staring positions toward the mounting surface 36, the drop starting positions being in a short distance above the mounting surface 36. By such a dropping, the lead portions 44b are accommodated in the positioning grooves 25, and the curved surfaces 45 of the body portions 44a are held by the edges 39c of the holes 39. That is, each body portion 44a is arranged at the mounting surface 36 in a state where a part of the curved surface 45 of the body portion 44a is accommodated in the hole 39 and the curved surface 45 is in contact with the edge 39c and is supported by the edge 39c, which is defined by the base surface 37 and the side surface 39a of the hole 39.

Each capacitor 44, which is arranged as described above, is positioned when, for example, a portion of the side surface 46 between the lead portions 44b touches the projecting portion 38a of the mounting surface 36. The capacitor 44 may be positioned when the ends of the lead portions 44b touch the closed ends 25b.

The capacitor 44 is restricted from moving in the direction intersecting the longitudinal direction, that is, the capacitor 44 is restricted from moving in the width direction of the positioning groove 25 when the lead portions 44b touch the side walls 25c.

Figure 10:
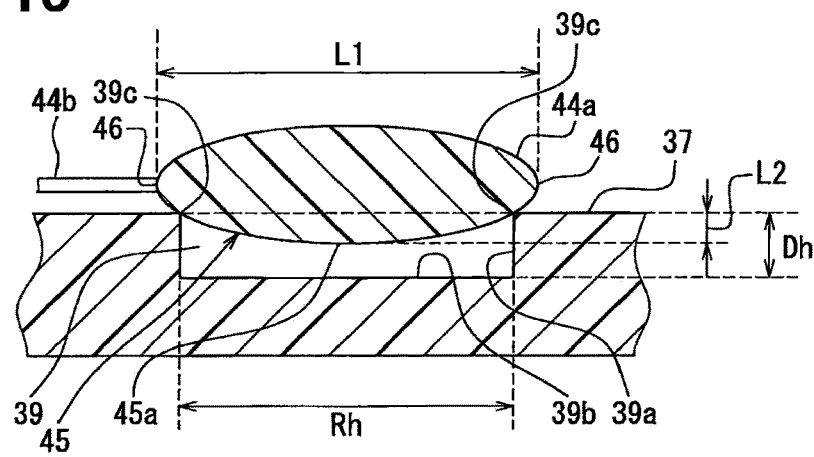
FIG. 10 is an enlarged diagram of a part of a cross-sectional view taken along a line X-X of FIG. 9 illustrating a state in which the capacitor is arranged.

Since the curved surface 45 of the body portion 44a is held by the edge 39c of the hole 39, the capacitor 44 is restricted from being displaced. Specifically, as shown in FIG. 10, in a cross section along the longitudinal direction of the capacitor 44, it is satisfied a relation in which a diameter Rh of the hole 39 is equal to or less than the dimension L1 of the body portion 44a in the longitudinal direction, and a depth Dh of the hole 39 is equal to or more than a projecting dimension L2 of the curved surface 45. The projecting dimension L2 is a height from the edge 39c of the hole 39 to a top 45a of the curved surface 45, which is held by the edge 39c of the hole 39, in a height direction of the cross section along the longitudinal direction. According to the relation, in the cross section along the longitudinal direction, since two points of the edge 39c of the hole 39 hold the body portion 44a, the edge 39c receives a weight of the body portion 44a. When a weight in the longitudinal direction is applied to the body potion 44a, the body portion 44a receives a repulsive force from the edge 39c of the hole 39 and is stopped. Therefore, since the capacitor 44 is held by the edge 39c of the hole 39, the capacitor 44 is restricted from moving in the longitudinal direction. In the present embodiment, since the edge 39c is formed circumferentially and the body portion 44a is held by an entire periphery of the edge 39c, the capacitor 44 is restricted from moving not only in the longitudinal direction, but also in an arbitrary direction along the base surface 37 by being held between the edge 39c of the hole 39.

In the present embodiment, even in the case where an error of the drop starting position occurs, the capacitor 44 is arranged at a desired position by the inclined surfaces 38c of the island 38. That is, when the drop starting position has an error in the width direction of the positioning groove 25, the lead portions 44b drop on the inclined surfaces 38c provided on the upper portions of the side walls 25c and slide down in the width direction, and thus the capacitor 44 is received at the desired position. When the drop starting position has an error in the longitudinal direction, the lead portions 44b drop on the inclined surfaces 38c provided on the upper portions of the closed ends 25b or the upper portions of the engaging portions 38b and slide down in the longitudinal direction, and thus the capacitor 44 is received at the desired position.

Figure 11:
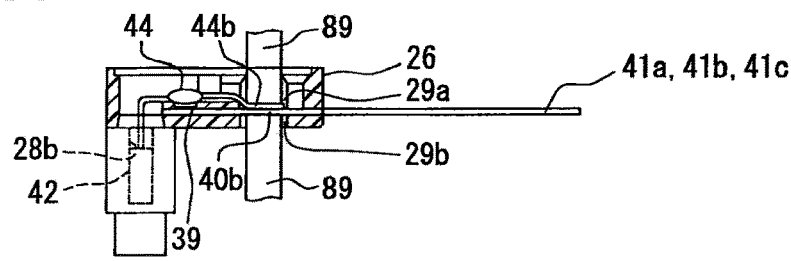
FIG. 11 is a diagram illustrating a connecting step of FIG. 5.

In the connecting step S40 after the arranging step S30, the lead portions 44b are connected to the terminals 41a to 41c. Specifically, as shown in FIG. 11, the electrodes 89 are inserted in each electrode hole 29a. The lead portion 44b and the capacitor connecting portion 40b are held between the pair of the electrodes 89. Since the lead portion 44b is held by the electrodes 89, the lead portion 44b is pushed to the capacitor connecting portion 40b. When the electric current is applied to the lead portion 44b and the capacitor connecting portion 40b through the electrodes 89 in a state where the lead portion 44b is pushed to the capacitor connecting portion 40b, Joule heat is generated in a contact region of the lead portion 44b and the capacitor connecting portion 40b. The contact region of the lead portion 44b and the capacitor connecting portion 40b is melted by the Joule heat, and the lead portion 44b of the capacitor 44 is connected to each of the terminals 41a to 41c by welding.

Figure 12:
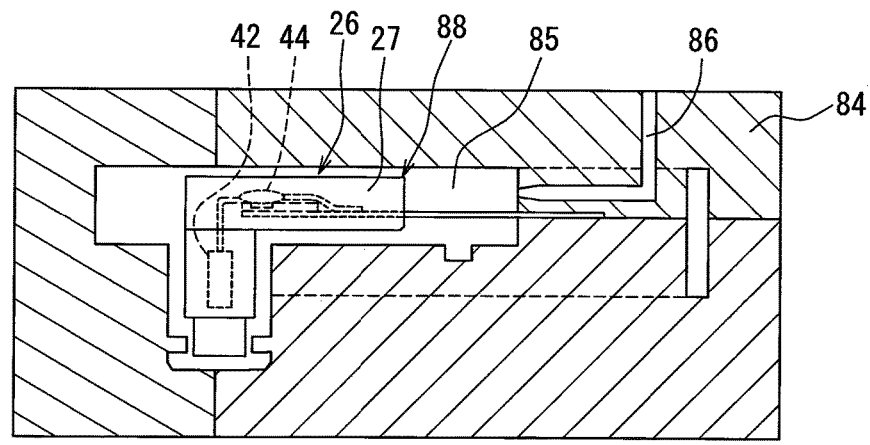
FIG. 12 is a diagram illustrating a covering step of FIG. 5.

In the covering step S50 after the connecting step S40, as shown in FIG. 12, the casing 26 is disposed in a cavity 85 of a second metal mold 84, and the molding material is inserted to the cavity 85 to cover the capacitors 44.

Specifically, the casing 26 is disposed in the cavity 85 of the second metal mold 84 at first. Thereafter, the molding material (for example, PPS resin) of the housing 20 is melted and inserted into the cavity 85 of the second metal mold 84 through a gate 86 provided in the second metal mold 84. As such, the capacitors 44 and the magneto-electric converting element 42 are covered and an exterior of the housing 20 is formed.

In the covering step S50, the peripheral wall 27 is located between the capacitors 44 and the gate 86 in the casing 26 disposed in the cavity 85 of the second metal mold 84. Since the capacitors 44 are surrounded by the peripheral wall 27, the peripheral wall 27 restricts the melted molding material, which is inserted into the cavity 85 through the gate 86, from flowing toward the capacitors 44. Also, the bottomed holes 39 restrict the molding material from flowing toward the capacitors 44 from a surface opposite to the mounting surface 36.

In the assembling step S60 after the covering step S50, the magnet holder 30 is fitted on the shaft portion 21 of the housing 20, which is formed in the covering step S50 described above. Furthermore, the float arm 50 is attached to the magnet holder 30, and the wirings 70 are connected to the terminals 41a to 41c. As a result, the fuel level gauge 100 can be obtained (see FIG. 1 and FIG. 2).

(Effects)

Effects of the present embodiment will be hereinafter described.

According to the present embodiment, in the arranging step S30, the lead portions 44b and the body portions 44a are arranged so that the lead portions 44b are placed in the positioning grooves 25 to extend along the base surface 37 and the curved surfaces 45 of the body portions 44a are held by the edges 39c of the holes 39. Because of this arrangement, even when the positioning grooves 25 have clearances from the lead portions 44b, the capacitors 44 can be restricted from being displaced. Furthermore, in the connecting step S40 after the arranging step S30, since the capacitors 44 are less likely to be displaced, the lead portions 44b and the terminals 41a to 41c are connected securely. As a result, the method for manufacturing the fuel level gauge 100 as a liquid-surface detection device capable of increasing a yield can be provided.

According to the present embodiment, in the cross-section along the longitudinal direction, since the curved surface 45 of the body portion 44a is held by the edge 39c of the hole 39, when the weight in the longitudinal direction is applied to the body potion 44a, the body portion 44a receives the repulsive force from the edge 39c of the hole 39 and is stopped. Therefore, the capacitor 44 is restricted from being displaced in the longitudinal direction.

According to the present embodiment, since the body portion 44a is held by the edge 39c of the hole 39, which is formed in the molding step S10 so that the center of the hole 39 coincides with the center of the curved surface 45 of the body portion 44a, the capacitor 44 can be arranged at the desired position. Therefore, the capacitor 44 can be restricted from being displaced by the simple arranging step S30.

According to the present embodiment, since the capacitors 44 are covered in the covering step S50 after the connecting step S40, the capacitors 44 can be restricted from being in contact with the fuel 91. Also, since the holes 39 are formed to have the bottom surfaces in the molding step S10, in the covering step S50, the molding material is restricted from flowing to the holes 39 from the surface opposite to the mounting surface 36 and the body portions 44a can be restricted from floating up and being exposed to outside.

According to the present embodiment, in the case where the lead portions 44b have the bent portions 47 that are bent to correspond to the distances between the terminals 41a to 41c, the engaging portions 38b of the island 38, support the positioning of the capacitors 44 in the longitudinal direction by engaging with the bent portions 47. Therefore, in the case where the body portions 44a are displaced from the holes 39, since the engaging portions 38b engage with the bent portions 47 of the lead portions 44b, the capacitors 44 can be restricted from being displaced.

In the present embodiment, the fuel 91 corresponds to a liquid, the fuel tank 90 corresponds to a container, the magneto-electric converting element 42 corresponds to a detecting element portion, the capacitor 44 corresponds to an electronic component and the fuel level gauge 100 corresponds to a liquid-surface detection device, respectively.

(Other Embodiment)

Although the embodiment of the present disclosure is described hereinabove, the present disclosure is not limited to the embodiment described above and may be implemented in various other ways without departing from the gist of the present disclosure.

Figure 13:
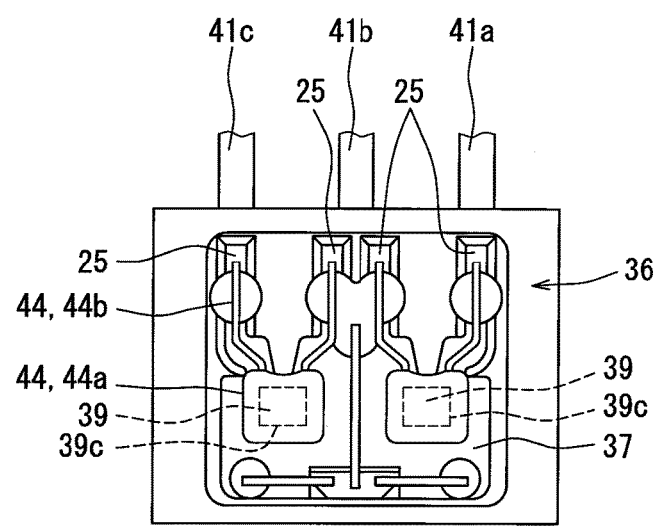
FIG. 13 is a front view of a mounting surface of a casing in an arranging step of a modification 1.

As a modification 1, the hole 39 may have a shape other than the cylindrical shape as far as the hole 39 has the edge 39c holding the curved surface 45 in the arranging step S30. In the modification 1, as shown in FIG. 13, each hole 39 has a rectangular shape recessed from the base surface 37 toward the terminals 41a to 41c. In the arranging step S30, two points of the edge 39c of four sides of the rectangular hole 39 hold the curved surface 45 in the cross-section along the longitudinal direction, and the other two points of edge 39c of the rectangular hole 39 hold the curved surface 45 in the cross-section along the width direction.

Figure 14:
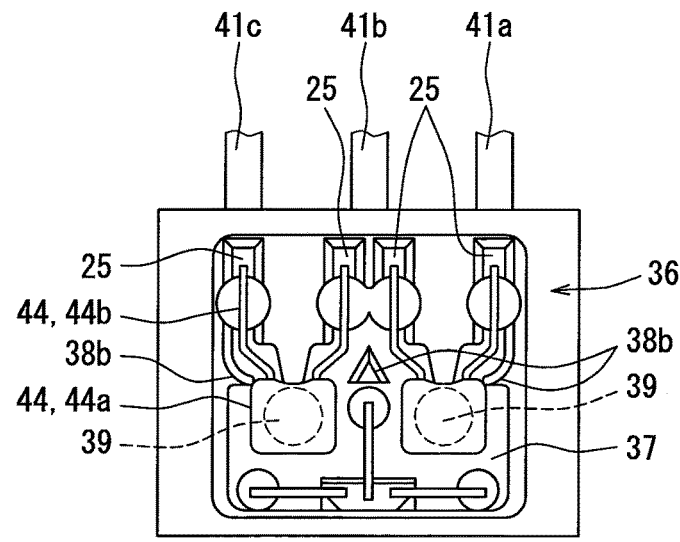
FIG. 14 is a front view of a mounting surface of a casing in an arranging step of a modification 2.

As a modification 2, as shown in FIG. 14, an engaging portion 38b projecting in the plate thickness direction may be provided at the inside of the casing 26, that is, at a center region of the mounting surface 36.

Figure 15:
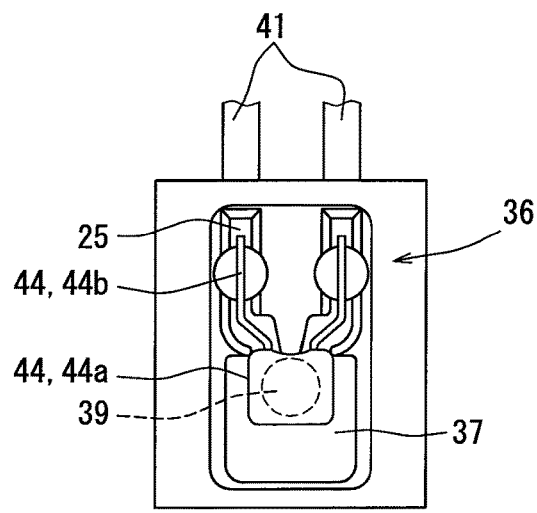
FIG. 15 is a front view of a mounting surface in an arranging step of a modification 3.

As a modification 3, the number of the terminals 41a to 41c and the capacitors 44 corresponding to the terminals 41a to 41c can be freely chosen. As shown in FIG. 15, the present disclosure can be employed to a liquid-surface detection device including two terminals 41 and one capacitor 44 corresponding to the terminals 41.

As a modification 4, the electronic component is not limited to the capacitor 44, and may be, for example, a resistor adjusting an output level of the magneto-electric converting element 42.

As a modification 5, the hole 39 may have the edge 39c holding the curved surface 45 in a cross-section along a direction other than the longitudinal direction, as far as the hole 39 has the edge 39c holding the curved surface 45 in a cross-section along any direction, in the arranging step S30.

As a modification 6, in the molding step S10, the hole 39 may have the center shifted from the center of the curved surface 45 of the body portion 44a.

As a modification 7, the covering step S50 may be replaced by other step.

As a modification 8, in the molding step S10, the hole 39 passing through the mounting surface 36 may be provided instead of the bottomed hole 39.

As a modification 9, in the molding step S10, the island 38 needs not have the engaging portions 38b engaging with the bent portions 47 in the longitudinal direction.

As a modification 10, an object to which the present disclosure is employed is not limited to the fuel level gauge 100 for a vehicle. The present disclosure may be employed to a vehicle-mounted liquid-surface detection device in a container of other liquid such as a brake fluid, an engine cooling water or an engine oil.

What is claimed is:

1. A method for manufacturing a liquid-surface detection device comprising:
providing a plurality of terminals for outputting an electrical signal corresponding to a detection result from a detecting element portion that is connected to the plurality of terminals, and that is detecting a level of a liquid-surface of a liquid stored in a container, to an outside of the container, and an electronic component connected to corresponding one of the plurality of terminals, the electronic component having
a body portion, and
a lead portion projecting from the body portion;
molding a casing that covers the plurality of terminals, the casing having a mounting surface that includes
a base surface with a planar shape and extending parallel to a direction in which the plurality of terminals extends,
an extension projecting from the base surface in a direction perpendicular to the direction in which the plurality of terminals extends, the extension further defining a positioning groove, and
a hole recessed from the base surface towards the plurality of the terminals;
arranging the lead portion and the body portion of the electronic component after the molding, so that the lead portion is placed in the positioning groove to extend along the base surface, the positioning groove having a clearance from the lead portion, and a curved surface of the body portion of the electronic component projecting toward the mounting surface is held by an edge of the hole; and
after the arranging, connecting the lead portion of the electronic component and the corresponding one of the plurality of terminals.

2. The method for manufacturing the liquid-surface detection device according to claim 1, wherein
a direction in which the lead portion of the electronic component projects during the arranging is referred to as a longitudinal direction, and
the body portion of the electronic component is arranged so that the curved surface is held by the edge of the hole in a cross-section defined along the longitudinal direction.

3. The method for manufacturing the liquid-surface detection device according to claim 1, wherein
in the molding, the hole is formed at a position so that a center of the hole coincides with a center of the curved surface of the body portion of the electronic component.

4. The method for manufacturing the liquid-surface detection device according to claim 1, further comprising:
after the connecting, covering the electronic component by disposing the casing in a cavity of a metal mold and inserting a molding material in the cavity, wherein
in the molding, the hole is formed to have a bottom surface.

5. The method for manufacturing the liquid-surface detection device according to claim 1, wherein
a direction in which the lead portion of the electronic component arranged in the arranging projects is referred to as a longitudinal direction,
the lead portion of the electronic component has a bent portion that is bent to correspond to a distance between the plurality of terminals, and
in the molding, the extension is formed to have an engaging portion to engage with the bent portion in the longitudinal direction.

* * * * *